United States Patent [19]

Noschese

[11] Patent Number: 4,585,291
[45] Date of Patent: Apr. 29, 1986

[54] DUAL-IN-LINE CONNECTOR ASSEMBLY
[75] Inventor: Rocco J. Noschese, Wilton, Conn.
[73] Assignee: Burndy Corporation, Norwalk, Conn.
[21] Appl. No.: 531,885
[22] Filed: Sep. 14, 1983
[51] Int. Cl.⁴ .......................................... H01R 13/506
[52] U.S. Cl. ............................ 339/117 R; 339/17 CF
[58] Field of Search ....... 339/117 R, 17 CF, 176 MP, 339/174

[56] References Cited
U.S. PATENT DOCUMENTS

| | | |
|---|---|---|
| 3,683,317 | 8/1972 | Walkup ............................ 339/174 X |
| 3,993,381 | 11/1976 | Horbach .......................... 339/17 CF |
| 4,245,877 | 1/1981 | Auriana ....................... 339/17 CF X |
| 4,491,378 | 1/1985 | Crawford .................... 339/17 CF X |
| 4,534,609 | 8/1985 | White .............................. 339/117 R |

Primary Examiner—Eugene F. Desmond
Attorney, Agent, or Firm—Ernest Fanwick; Clarence A. Green; Martey R. Perman

[57] ABSTRACT

A dual-in-line connector assembly of the closed-entry, closed-bottom type having an integral structure comprised of a base and a body of closely conforming configuration. The integral assembly defines a number of socket areas arranged in two parallel rows which communicate with a flux rinsing drainage system comprising a plurality of drainage paths of two different configurations which lead to orifices in the assembly exterior located away from the contacts. Drainage paths of the first type include a drainage chute in the socket area floor which lead directly to the exterior via an opening in the bottom of the drainage chute. The second type of drainage path includes a similar drainage chute leading to a large drainage opening that communicates with an extended oval-shaped centered recess which contributes a dual function of effecting a snap-on locking assembly arrangement. The drainage system includes a large interconnecting space which enables each pair of adjacent contacts to be served by both configurations of drainage paths. The contacts have question-mark-like configuration in which the upper portion is arranged in the respective socket area to effect a spring-loaded contact with the lead of an integrated circuit such that a gas-tight high pressure connection is achieved therebetween. The contact structure itself precludes permanent deformation of the upper free end during insertion of the IC lead and the socket area housing is shaped to prevent its dislodgement during IC lead removal.

23 Claims, 10 Drawing Figures

FIG. 2B.
FIG. 2C.
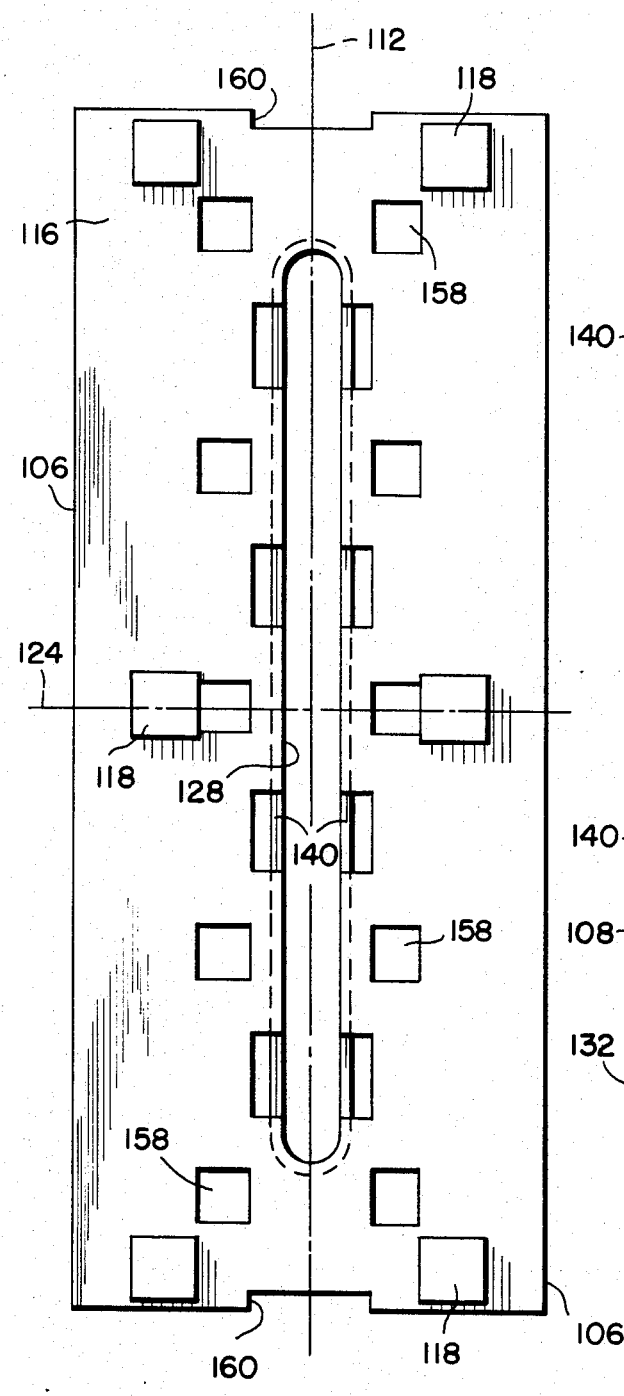
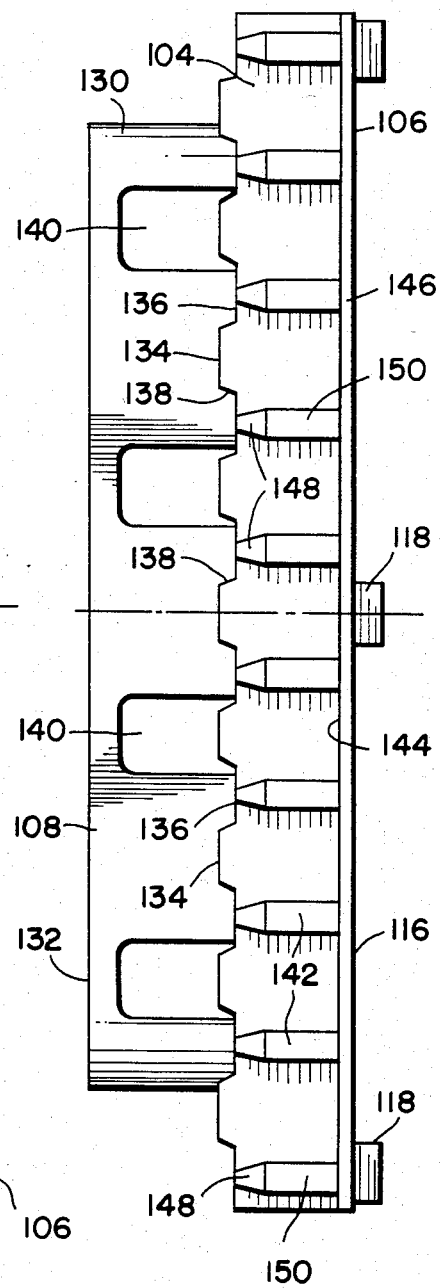

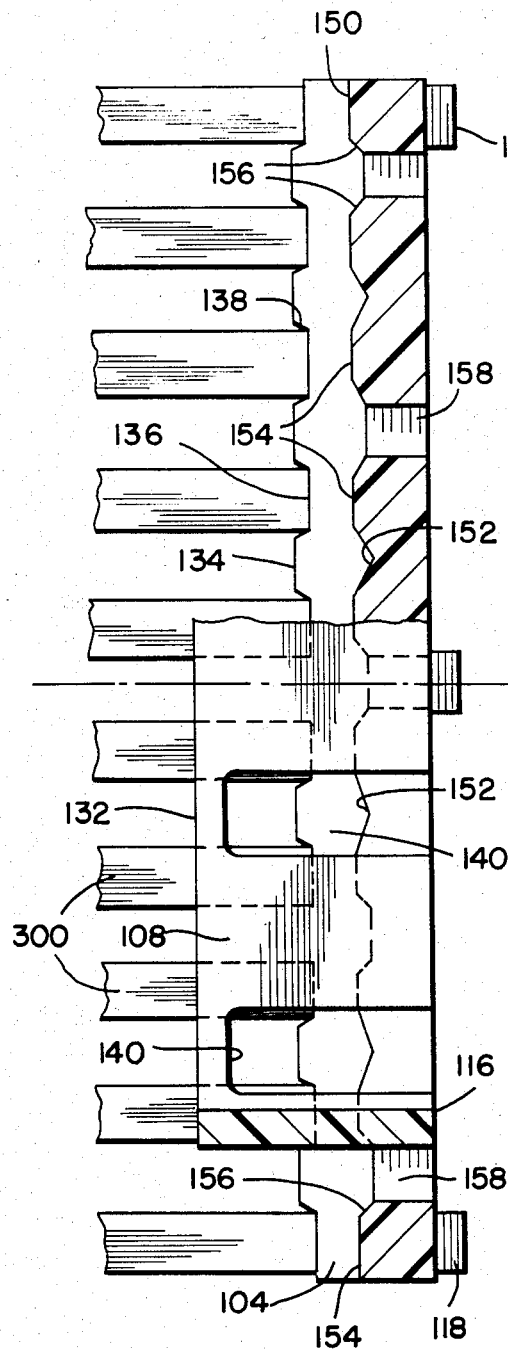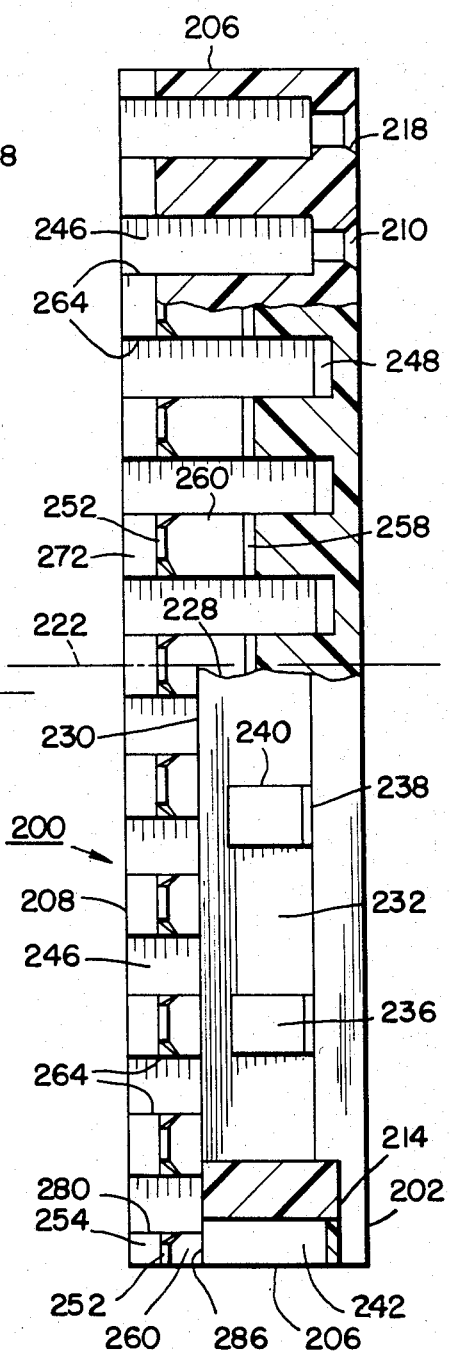

DUAL-IN-LINE CONNECTOR ASSEMBLY

BACKGROUND OF THE INVENTION

This invention relates to dual-in-line (DIL) connector assemblies for mounting integrated circuit (IC) components and the like to circuit boards such as printed circuit boards, and, more particularly, to connectors of this type having a so-called closed-entry, closed-bottom integral structure.

Areas of consideration to be addressed in the design of a DIL connector are its proper attachment to the circuit board and the ability to removably mount an IC without damage or undue force. Present practices of securing a DIL connector to a circuit board by its pins include both soldering techniques and mechanical techniques. The word "pin" as used herein represents that portion of the contact which protrudes from the bottom surface of the connector assembly.

Known mechanical techniques include the use of pin configurations designed to provide an interference fit in the associated metallized holes of the circuit board. Known interference-fit type pin designs have the problem of circuit board hole tolerance requirements.

Securing DIL connectors to the circuit boards by soldering may be accomplished through several processes. So-called wave soldering is an example of an efficient mass production technique. As part of this technique, flux material is first used to clean the contacts and to promote the joining of the metals in the soldering process. With the contacts so prepared, and protruding through the associated holes in the circuit board, the underside of the board is subjected to a "wave" of solder. Following a suitable cooling period, the flux is rinsed from the assembly, usually by applying a hot water spray. The flux cleaning step is included since flux remaining in the connector tends to corrode the contacts in the socket area over a period of time. It is, thus, essential to remove as much of the flux from the connector assembly as possible. As used herein, the phrase "socket area" refers to the chamber portion of the connector that houses the part of the contact which is intended to engage the IC lead.

Known soldering techniques, in spite of their efficiencies, give rise to substantial problems relating to the deposited solder itself as well as the flux material. For example, solder "bridging" may occur. This is the condition wherein the solder bridges over from the connector pin and its associated circuit board hole to an adjacent circuit making electrical contact therebetween.

Bridging tends to occur more frequently in cases where portions of the contact remain above the circuit board in close proximity to other circuit paths. When these portions of the contacts are parallel to the plane of the board, bridging is more likely to occur.

"Solder wicking" is another problem which is associated with the soldering of these contacts. This is a condition in which molten solder travels along the pin portion of the contact up into the connector assembly, and in particular, into the socket area. Wicking is particularly undesirable in connector structures having contacts configured to provide a form of spring-loaded interference fit with the IC lead since the solder clinging to the contact may hamper its bending ability. Altered flexibility of the contact spring may adversely affect the characteristics of the electrical connection between the contact and an IC lead.

The problem of wicking may be compounded in cases where soldering is performed with the IC already mounted into the connector assembly. Under this condition, the solder may bridge over onto the IC lead as well. This, of course, makes removal of the IC difficult at best and will likely lead to permanent damage to either or both the contact and the IC, especially if removal of the latter is attempted.

With present soldering techniques, the design and configuration of the connector assembly itself must be relied upon to minimize or eliminate the aforementioned problems. Known solutions for minimizing or eliminating occurrences of solder bridging have mainly involved the use of simple straight pins. Wicking has generally been countered by providing the connector assembly with some form of a so-called closed-bottom structure. A combination of the two is, of course, also possible.

A closed-bottom structure is one in which the openings in the bottom surface of the connector assembly, through which the pins emerge, are narrowly restricted in size so as to be little more than the cross-section of the pins themselves. This may be accomplished either by having the connector assembly holes physically limited in size, or by using an external underlay of suitably non-conductive material such as polyester strips. The underlay is intended to effectively close or narrow what otherwise would be considered an open-bottom structure. The use of self-adhesive sheet materials for this application is also known.

A connector designed with a closed-bottom, per se, structure requires that its contacts be inserted from the top in unitary connector constructions. In such a case, a closed-entry structure is not possible; it would have to be achieved by some external means, such as an open-bottom which is subsequently covered by an underlay.

When using an underlay to create an effective closed-bottom configuration, one cannot ignore that proper assembly and positioning of the underlay is absolutely essential, and, thus, tolerances tend to become critical.

With either of the closed-bottom solutions discussed above, if flux contamination does occur in the socket area (a distinct possibility in mass production techniques), it is extremely difficult to effect satisfactory rinsing of the flux from this area. This problem is, of course, alleviated by an open-bottom structure, but, as already indicated, such designs fall prey to the hereinbefore discussed problems of solder bridging and wicking.

While the use of substantially straight pins does represent a relatively satisfactory solution for avoiding solder bridging, various practical and commercial reasons have made it advantageous to utilize a contact configuration which is appreciably bent over the course of its length below the socket area of the connector assembly (and specifically the pin portion). This is particularly the case where the DIL contact has been designed as a singular element structure to achieve a spring-loaded interference contact with the IC lead, having the free end of the contact in the socket area extending at an angle to the direction of insertion of the IC lead. This configuration is desirable in that it enables good electrical contact with and securely holds the IC lead. It also allows an acceptably low IC insertion force and a substantially damage free removal thereof. However, it does necessarily complicate installation into the connector housing, especially if a closed-entry, closed-bottom structure is contemplated.

This invention, therefore, provides a closed-entry and closed-bottom connector assembly which avoids wicking and bridging and facilitates flux removal. The closed-entry, closed-bottom aspects are achieved within the structure of the connector itself as opposed to any external measures such as an underlay. The assembly utilizes a singular-element contact configuration shaped to achieve the aforementioned highly desirable spring-loaded type interference fit with the IC lead. The structure effectively eliminates solder wicking and bridging while facilitating flux rinsing to avoid corrosion.

With more specific regard to the aspects of nounting the IC to the connector, a commercially acceptable connector should provide: (1) guidance of the IC lead into proper (non-destructive) engagement with the connector contact in the socket area; (2) secure, but removable, contact engagement with the IC lead without requirement for undue insertion or removal forces; and, (3) continuous, reliable electrical contact between the IC lead and the contact. The contact configuration of a connector assembly providing these attributes should nevertheless be simple enough to minimize fabrication and installation costs and problems.

The desire to have a closed-entry structure, alluded to hereinbefore, stems from the need to guide the IC lead into proper, smooth engagement with the connector contact in the socket area. It also prevents insertion of deformed or oversized contacts or probes avoiding a jarring collision which could cause permanent deformation or breakage of the contact. A closed-entry structure, similar to a closed-bottom structure, is one where the opening of the connector into the socket area for insertion of the IC lead is restricted in size so as to be not substantially greater than the cross-sectional dimensions of the IC lead itself. Of course, the opening into the socket area can be beveled to facilitate guidance of the IC lead.

An alternative to closed-entry construction of the connector housing is to provide relatively more complex contact structures in the socket area wherein the contact itself guides the IC lead and facilitates non-destructive insertion and withdrawal. Such complex contacts would necessarily cost more to manufacture. Special fabrication and assembly considerations are likely to be required for such contacts, as are larger dimensions and more material.

The need to provide proper guidance of the IC lead during insertion is especially essential in those known cases where the connector contact is singular. Deformation of such a contact would impair its ability to achieve good electrical contact with the IC and to effectively hold it in place. Use of this contact configuration normally would be precluded in a unitary closed-entry, closed-bottom connector assembly.

Nevertheless, the singular contact configuration is preferred for various reasons, including economy. The importance of contact configuration cannot be underestimated in attaining the goal of a reliable, cost competitive, mass produceable connector assembly. The IC should be securely held in the socket area by the connector contact and yet allow removal of the former without undue withdrawal forces being required or damage occurring.

This invention, therefore, provides a DIL connector assembly of the closed-entry, closed-bottom type in which the contacts are fabricated from relatively inexpensive material, proper guidance of the IC leads into the socket areas is assured and gas-tight contacts are effectively achieved. The invention, however, enables relatively low and non-destructive insertion and withdrawal force requirements.

SUMMARY OF THE INVENTION

The present invention provides a relatively inexpensive, mass-produceable, integral DIL connector assembly of the closed-entry, closed-bottom type intended for soldering to a circuit board. The connector is comprised of a base, a conforming body, and contacts of singular-element configuration which provide all of the aforementioned desirable properties in the socket area. The connector avoids the aforementioned drawbacks by providing effective flux flushing capability from built-in, non-metallic drainage paths apart and away from the pin portions of the connector contacts.

The connector contacts are formed from flat metal stock which is bent into a question-mark-like configuration and may be constructed of any suitable, metal material such as beryllium copper, phosphor bronze, and brass. The contacts are advantageously bent to achieve the question-mark configuration such that a section of each is substantially parallel to the plane of the circuit board. This section is, however, safely housed within the connector assembly beyond the closed-bottom structure, thus, effectively avoiding solder bridging. The contacts are oriented such that the free end of the upper portion of each faces outwardly in the socket area. The question-mark configuration facilitates guidance of the IC lead and requires only a low insertion force, and, yet, it can achieve an effective gas-tight contact engagement.

Overstressing of the contact during IC insertion is prevented via the contact configuration itself in that the free end of the contact is only permitted to bend downwardly and inwardly until it abuts itself. Abutment occurs at the knee of the question mark, a point well within the limit for avoiding permanent deformation. This obviates the need for, and thus the expense of, the use of additional materials or any special means such as tabs or ears, to be designed into the configuration of the contact, for intercepting another structure such as a limit stop surface provided in the connector body.

The contact configuration allows construction from minimal stock; for example, no tabs or ears, etc., and, yet, it is hardy in carrying out its multifunctional operation over prolonged usage. The pin portion of the connector contact, in one embodiment, may be provided with an outwardly-directed bump, located along the mid-section of its length, to be positioned inside the circuit board hole when the connector assembly is mounted thereon. Outwardly directed bumps of the two opposing rows of connector pins may be used to provide a simple, but effective, interference type fit and, thus, a means for holding the connector in position on the circuit board during soldering.

In accordance with one embodiment of the invention, the two-piece connector assembly achieves, within itself, a closed-bottom structure, without underlay or other external measures, that effectively eliminates solder wicking and bridging to the IC lead in the socket area. Highly effective flux rinsing is achieved through non-metallic flushing paths leading from the socket areas which are entirely apart from the paths the contacts take through the structure to finally emerge from its underside. The multiple flushing paths comprise a drainage hole and a major drainage opening in the base provided for each pair of contacts adjacent thereto.

The drainage openings, in one embodiment, serve the dual function of providing the seats for tabs on the body that effect a snap-on assembly configuration. They are located in the walls of a single, longitudinally-running, extended, hollow oval structure, rising from the center of the base, which facilitates the assembly of the base to the body in the snap-on locking manner.

The closed-entry configuration of the body of the contact assembly provides proper guidance of the IC lead into non-destructive engagement with the contact in the socket area. This configuration includes a lip or shoulder which extends along the inner side of the opening to the socket area and is downwardly directed from the ceiling of the latter. It aids the question-mark-shaped contact in resisting dislodgement or deformation upon IC withdrawal.

The outside wall of the socket area, in one embodiment, is utilized in conjunction with the shallow-angled, flat, free-end of the contact as a positive guide to the IC lead. This wall may also be provided with one or more molded-in ramps suitably positioned to ensure that the contact free-end assumes the desired shallow angle and a spring-loaded effect.

The ends of the connector, in one embodiment, are provided with a registration feature for establishing correct connector assembly installation orientation. Each end surface has a top-to-bottom running groove in which a thin, readily-removable flap resides oriented in the plane of the connector. In the manufacturing process, or thereafter, one of the flaps may be removed, as desired.

BRIEF DESCRIPTION OF THE DRAWINGS

The above-mentioned and other objects and features of the invention will become apparent and the invention itself better understood with reference to the following detailed description of preferred embodiments taken in conjunction with the accompanying drawings, in which:

FIGS. 2A-2C are, respectively, top, bottom and side views of the base of the connector assembly of FIG. 1;

FIG. 3 is a breakaway side view of the base taken along the line 3—3 of FIG. 2A with contacts partially shown;

FIG. 6 is a cross-sectional side view of the body taken along the line 6—6 of FIG. 5B.

DESCRIPTION OF THE PREFERRED EMBODIMENTS

Figure 1:
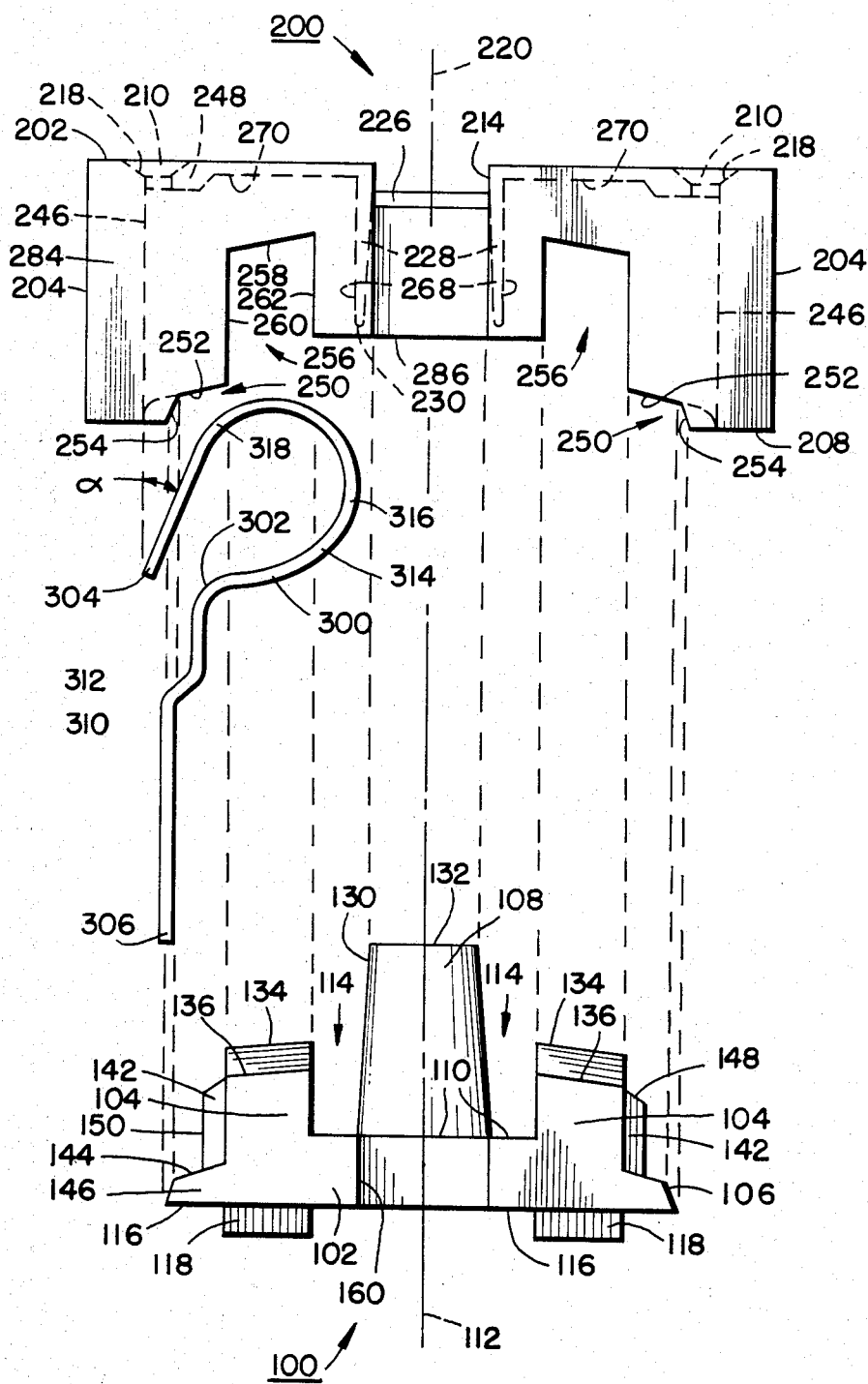
FIG. 1 is an exploded end view of the connector assembly in accordance with the invention.

FIG. 1 illustrates, in an exploded end view, a DIL connector assembly incorporating the present invention. It is comprised of a base 100 and a body 200, of closely conforming configuration, with contacts 300 suitably configured to be securely housed in the integral assembly formed by the two.

The contacts 300 are preferably fabricated of beryllium copper. The configuration of the contacts resembles a question mark (see FIGS. 1 and 7) with the upper, free-end 304 forming a shallow angle $\alpha$ with the vertical, and, more particularly, with a properly inserted IC lead.

Figure 2A:
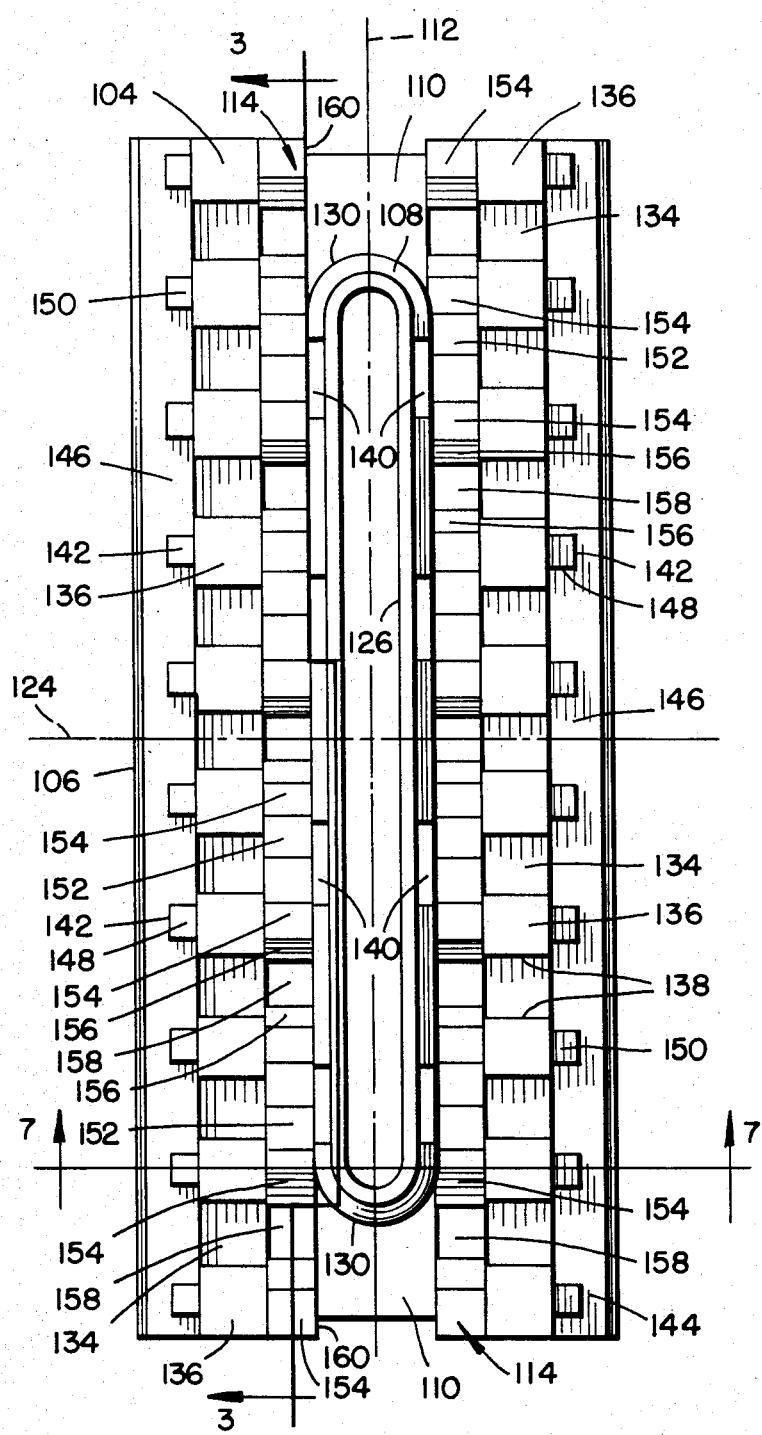
Figure 4:
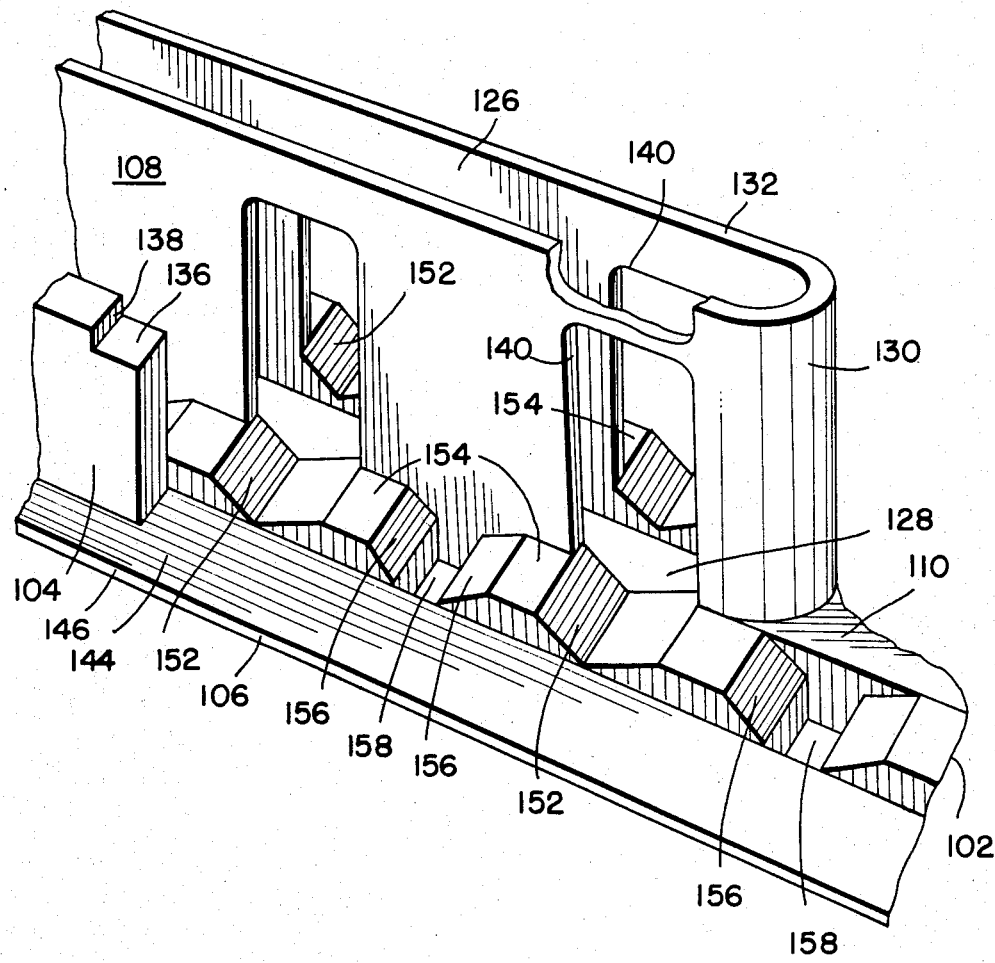
FIG. 4 is an enlarged breakaway perspective view of a portion of the base featuring the drainage chutes, holes and openings.

The base 100 is illustrated in the top, bottom and side views, respectively, of FIGS. 2A-2C as well as the breakaway cross-sectional side view of FIG. 3 and the enlarged breakaway perspective view of FIG. 4. With reference to these figures, and in conjunction with the exploded end view of FIG. 1 and the cross-sectional end view of the connector as fully assembled in FIG. 7, the base 100 of the integral assembly is an elongated unitary structure. It is comprised of a bed 102, a centered structure 108 which uniformly rises from the bed 102 symmetrically along the longitudinal axis 112 (FIG. 2A) to within a short distance of each end of the base, and elongate raised portions 104 symmetrically arranged in parallel with and to either side of structure 108. Raised portions 104 rise at their highest levels to approximately half the height of structure 108 and extend from one end of the base to the other near the respective side edges 106 of the bed 102. The raised portions 104 in conjunction with the center structure 108 thus form a pair of longitudinally-extending, parallel channels 114. There is one channel on either side of the structure 108, the floor of each channel being at least in part level with the top surface 110 of the bed 102.

The bottom surface 116 of the base is provided with several spaced apart feet or support pods 118 which provide a substantially uniform separation between the lower surface 116 of the base 100 and a circuit board 400 (FIG. 7) when the former is mounted onto the latter. In the embodiment depicted in the Figures, the feet or pods 118 of the base are square as viewed perpendicularly to the plane of the bed 102 (FIG. 2B), and are preferably six in number. One is proximate with each of the four corners while the other two are likewise proximate with the respective outer side edges 106 of the bed 102 but preferably centered on the transverse axis 124 of the base 100 (FIG. 2B).

In an effort to simplify discussion, it is to be noted that the base 100 is entirely symmertrical with respect to the perpendicular plane 120 (FIG. 1) that includes the longitudinal axis 112 and also with respect to the perpendicular plane 122 (FIG. 2C) which includes its transverse axis 124. The body 200, to be discussed in detail hereinafter, is similarly symmetrical about the perpendicular planes 220 (FIG. 1) and 222 (FIG. 6) which, respectively, include the longitudinal axis 212 and the transverse axis 224 thereof (FIG. 5A), with one exception. This exception is the connector installation orientation or registration flag 226 which will be discussed primarily in connection with FIGS. 5A and 5B hereinafter.

The central raised structure 108 of the base 100 is hollow having a vertical passageway 126 (FIGS. 2A-B, 4 and 7) of substantially uniform cross-section originating at the top 132 thereof which continues downwardly through the bed 102 to become opening 128 in the bottom surface 116 (FIG. 2B) of the base 100. The passageway 126 and the structure 108, itself, are oval shaped, as may best be seen in FIGS. 2A and 2B.

The external side surfaces 130 of central structure 108 are uniformly slightly tapered upwardly to facilitate the assembly of the base 100 with the body 200 as will be more particularly described hereinafter. Structure 108 constitutes the principal guide means by which the base and body are properly united.

There are in each of the long sides 130 of structure 108 equispaced apart opposing drainage openings 140 (four in the depicted example of embodiment) which extend from the bottom surface 116 of the bed 102 (FIG. 2A) upwardly to just short of the top surface 132 of the structure 108 (FIGS. 2C and 4). Drainage openings 140 are preferably substantially rectangular in shape and are dimensioned (especially side-to-side) to function and closely fit with specific portions of the body 200 comprising in concert a snap-on arrangement which is discussed further hereinafter.

Openings 140 have the dual function of providing major drainage paths for rinsing flux from the socket area's housing, the upper portions of the contacts and the lower interior walls of the channels 114 to the exterior of the connector assembly via large oval opening 128. These major drainage openings 140 are spaced along the oval body of structure 108 to be closely accessible to the contacts; for example, preferably, one drainage opening for each pair of adjacent contacts 300 (see FIG. 3).

The elongate portions 104 of the base 100 have matching top surfaces comprised of alternating contiguous flat plateaus 134 and valleys 136 (FIGS. 2A and 3 in particular). The plateaus 134 are uniform in height and surface area as the valleys, and the surfaces of each are substantially square. The sides 138 of the plateaus/valleys are, preferably, slanted such that the plateaus 134 have a slight upward taper and the valleys a corresponding slight downward taper. Additionally, the top surfaces of portions 104, which comprise the valleys 136, are, preferably, uniformly slanted downwardly in a direction toward the side of the base and away from center structure 108 (FIG. 1). The top of plateaus 134 are likewise slanted, but, preferably, to a somewhat lesser degree.

Figure 7:
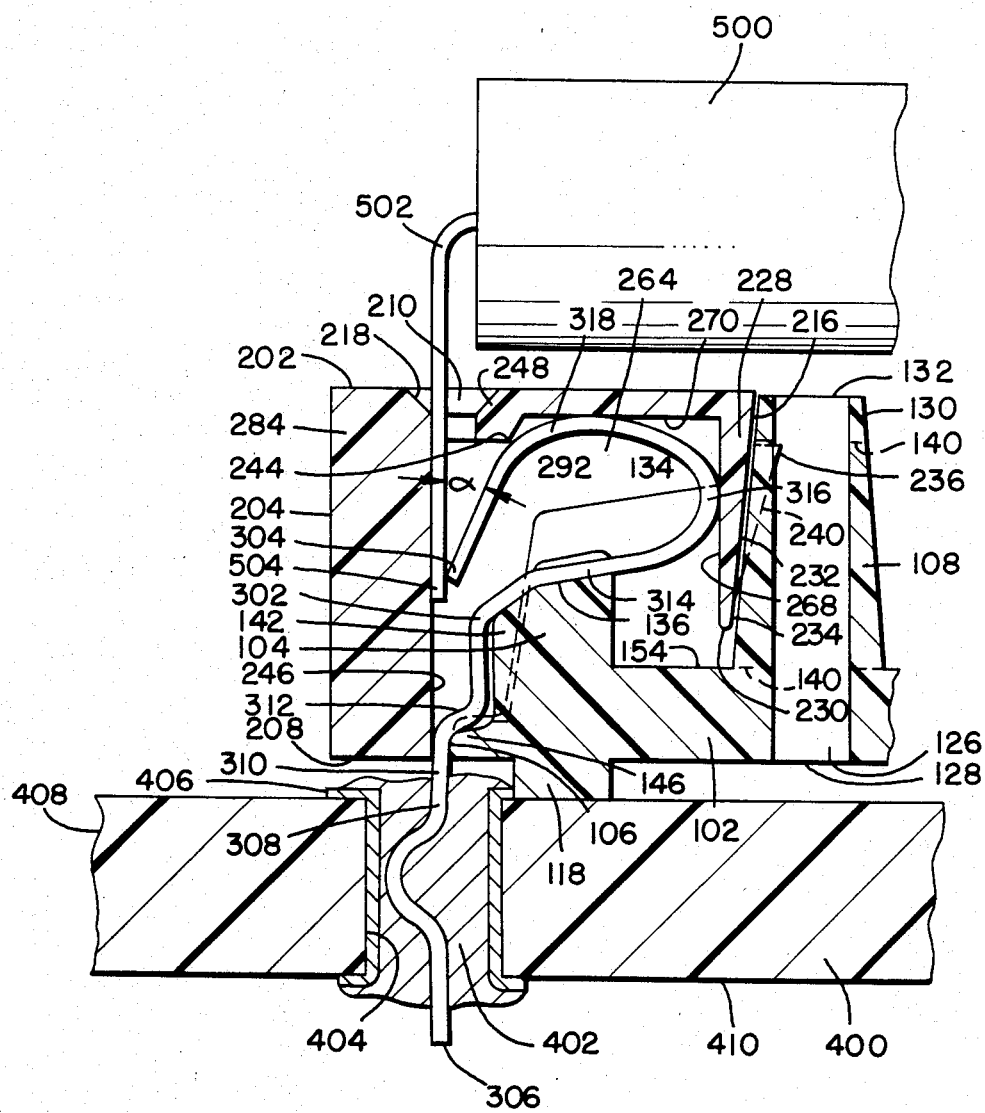
FIG. 7 is a cross-sectional end view of the connector of FIG. 1 fully assembled and mounted on a circuit board with an IC in place, with the body and base being taken along the lines 7—7 of FIGS. 5A and 2A, respectively.

As may be gathered from FIGS. 3 and 7 in particular, valleys 136 provide seats for the flat contacts 300, the sidewise dimensions of which are, in turn, defined by the side edges 138 of the plateaus/valleys. The difference in height between the valleys 136 and plateaus 134 is, preferably, sufficient to accommodate the thickness of the contacts 300. The seats defined by surfaces 138 closely conform to the relatively narrow width dimension of the flat contacts.

The plateaus and valleys alternate continuously from one end of the elongate raised portions 104 to the other, beginning at each end with a valley 136. The contact seats, defined by the outermost valleys, are completed by the respective end side surfaces of the body 200.

FIGS. 2C and 3, in particular, illustrate the positional relationship between the plateaus, valleys and seats of elongate portions 104 on the one hand and the drainage openings 140 of the oval structure 108 on the other. A plateau 134 is, preferably, centered with respect to each of the openings 140. The two seats defined on either side of the plateau are, thus, symmetrically arranged within a close distance from this opening and are operatively associated thereto.

The side dimensions of the square surfaces to the plateaus 134 and valleys 136 are substantially the same and are on the same order as the separation distance between the long sides of oval opening 128 in the bottom surface 116 of the base 100. This dimension is slightly greater than the width of the channels 114 formed between elongate portions 104 and oval center structure 108.

It should be noted that the drawings depict the example situation of a connector assembly intended to house ten contacts on each side of the longitudinal axis 112. Thus, there are ten seats provided on each elongate portion 104 and a corresponding nine dividers or plateaus 134. The length of the connector is, preferably, standard for ICs of this size; for example, on the order of about 1.000 inch. Preferably, the height of the connector housing above a circuit board, when fully assembled is no more than about 0.175 inch and its width about 0.400 inch.

Associated with each valley or seat 136 is a rib 142 (FIGS. 2C and 7) on the outer side surface of the elongate portion 104. Ribs 142 are elongated vertically; that is, substantially perpendicular to the bed 102, and are substantially square in a cross-section taken parallel to the plane of the bed 102 (see FIG. 2A). Ribs 142 are topped with a surface 148 which slants downwardly toward the respective side edge 106 of the base 100. The ribs extend down to a substantially horizontal surface 144 which constitutes the top surface of the outermost part 146 of the bed 102; that is, that portion of the bed lying outside elongate portions 104. Surface 144, preferably, has a slight downward slant toward the side edge 106 of the base to facilitate a close fit of the base to a corresponding part of the body 200. Ribs 142, thus, give the outer side surface of elongate portions 104 a uniformly ribbed appearance.

These ribs 142 provide, first of all, a guiding function for proper positioning of the flat contacts 300. The raised top 148 and outer side (vertical) surfaces 150 thereof, ensure that the mid-portion of the contact is directed outwardly and toward the desired point of exit from the bottom of the connector between the base and body. This aspect is more particularly discussed hereinafter. From FIG. 7 especially, however, it can be gathered that a critical function of the rib 142 is to ensure a knee bend 302 is provided in the contact 300. This marks the approximate point at which the contact begins its descent from the socket area toward the bottom surface of the connector. It is this bend portion 302 of the contact which ensures that the contact's free-end 304 is prevented from being overstressed when inserting the IC lead. Free-end 304 can only travel inwardly until it contacts the knee bend 302 as supported by rib 142.

The two channels 114 defined between the center oval structure 108 and the elongate portions 104 have matching floors of complex configuration. The floor is particularly well illustrated in FIGS. 2A, 3 and 4. Referring to these figures, the floor of each channel is provided with a number of drainage chutes 152, one directly communicating with each of the drainage openings 140 of structure 108. Drainage chutes 152 are each comprised of a pair of inclined surfaces slanting downwardly toward one another and meeting to form a trough which facilitates the escape of the flux rinse through the associated drainage opening from the socket areas of the contacts located to either side of that drainage opening/drainage chute.

Each of the opposing inclined flat surfaces forming a drainage chute 152 terminates at its high edge in a substantially square flat surface 154 oriented parallel to the plane of the bed 102 and elevated somewhat with respect to the surface 110 of the base. The far edge of each horizontal surface 154; that is, the edge farthest away from the nearest drainage chute 152, marks the beginning of another flat inclined surface 156 sloping downwardly from the flat surface 154 to face and intercept a like surface of opposing incline. The pair of opposing inclined surfaces 156 forms a secondary drainage chute.

Between each pair of opposing inclined surfaces 156 in the bottom of the secondary drainage chute formed thereby is located a drainage hole 158. Hole 158 is preferably, of substantially square shape and running through the base 100 to communicate with the bottom surface 116 (FIG. 2B). The secondary drainage chutes formed by inclined surfaces 156 and the associated drainage holes 158 constitute second routes for the flux rinse to escape from the connector assembly for each contact. As is the case with the primary drainage chutes 152, each secondary drainage chute is arranged to serve the contacts located to either side. Thus, each contact socket area is in close communication with one primary and one secondary drainage path. In the example of embodiment depicted in the figures, the floor of each channel 114 has four drainage chutes 152 corresponding to the four drainage openings of structure 108 and five secondary drainage chutes 156/156 each having a square drainage hole 158 therein.

Between each end of the central oval structure 108 and the respective end of the base 100 is a flat horizontal area constituting the upper surface 110 of the base. The width of this flat area corresponds to the width of oval structure 108. Each end of the base is provided with a substantially square-off recess 160 which is aligned, in width dimension, with the flat area 110. The purpose of recesses 160 is to complete a top-to-bottom recess in the connector assembly when the base and body are united, as will be more particularly discussed hereinafter.

Figure 5A:
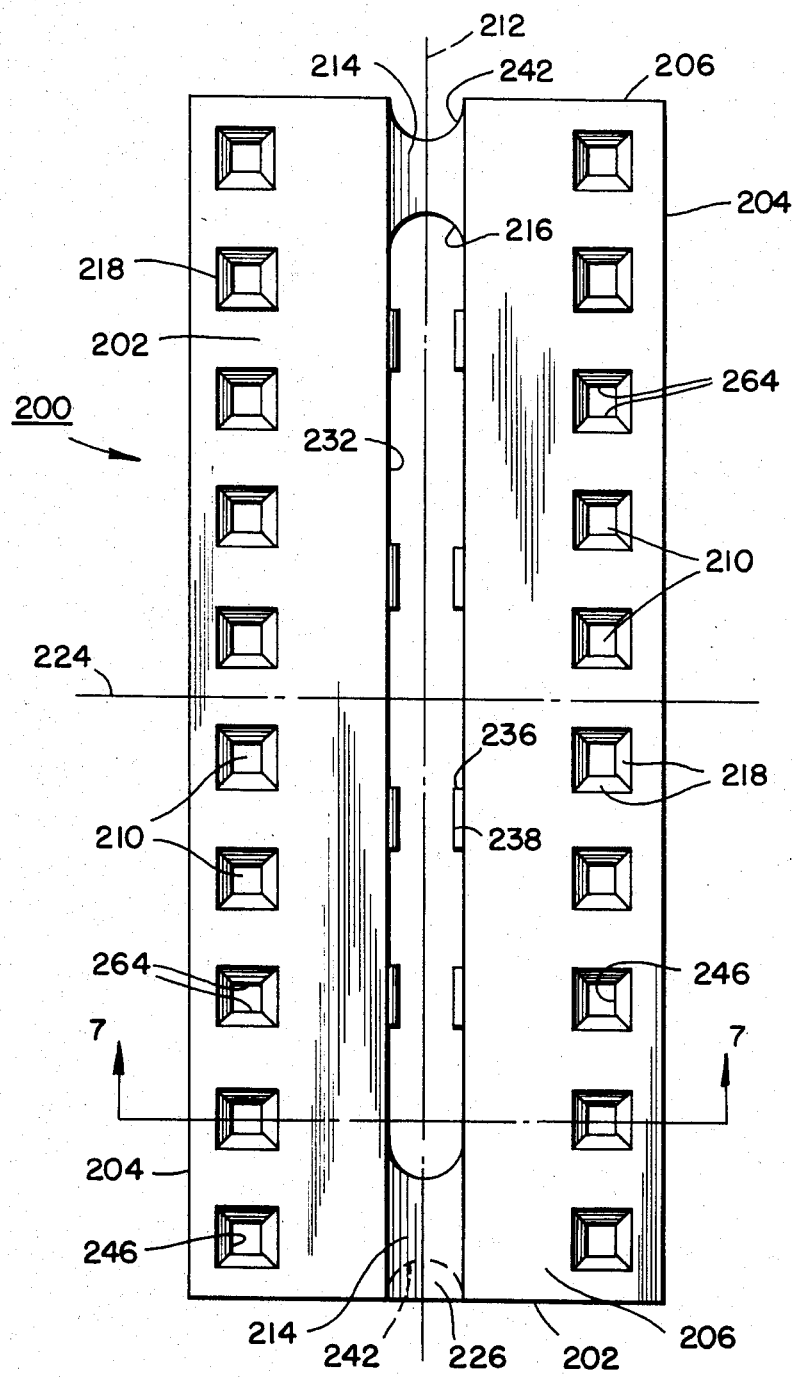
FIG. 5A-5B are, respectively, top and bottom views of the body of the connector assembly of FIG. 1.

Referring now to the body 200 of the connector assembly, this structure is illustrated in top and bottom views in FIGS. 5A and 5B, respectively, in end and cross-sectional end views in FIGS. 1 and 7, respectively, and in a cross-sectional side view in FIG. 6. The body 200 is substantially rectangular in appearance having a top surface 202, long side surfaces 204, end side surfaces 206 and a bottom surface 208. The top surface 202, which is best viewed in FIG. 5A, bears the dual parallel rows of entry holes 210 for receiving the IC leads. Consistent with the example of the embodiment depicted throughout the drawings, each row numbers ten entry holes 210. These openings to the corresponding socket areas below are provided with inwardly declining sloping sides 212 wherein each opening in the surface 202 quickly tapers down to a socket area orifice of roughly ¼ the size; for example, preferably about 0.026 inch. This bevel-like, closed-entry configuration provides the initial requisite guiding factor to ensure easy and non-destructive engagement of the IC lead with the connector and in particular the contact located below.

A groove or recess 214 in the top surface 202 extends end-to-end along the longitudinal axis and is centered thereon. The groove 214 has a substantially squared-off cross-section with a width that closely corresponds to the exterior width dimension of the top 132 of the raised oval structure 108 of the base 100 (FIG. 1). In this groove 214 is a large longitudinally-elongated oval-shaped passageway 216 extending vertically through the body 200. The oval passageway 216 extends near each end of the groove 214 in lengthwise dimension, which closely conforms with the lengthwise dimension of oval structure 108 of the base 100.

The surfaces 232 of the side walls 228, which define the passageway 216, are substantially vertical though uniformly downwardly slanting outward. Sidewalls 228 uniformly terminate in a bottom surface 230 which defines an elongated oval orifice 234 marking the bottom end of passageway 216 through the body 200. This occurs at approximately ⅔ of the way down from the total height of the sides 204 of the body.

Sidewalls 228 form the structural part of the body 200 for receiving, in close fitting manner, the raised oval structure 108 of the base 100 when body and base are assembled together. Since the substantially vertical side walls 228 are outwardly slanting, they, thus, define the passageway 216 as an extended oval shape, in the plane of the body, with continuously decreasing dimension in the direction from the bottom surface 230 of side walls 228 to the top surface 202 of the body. This facilitates engagement of the oval base structure 108 therewith. When assembled, the base and body fit together such that the top surface 132 of the oval base structure 108 is, preferably, flush with the top surface 202 of the body.

Molded-in ramp structures 236 are provided on the surfaces 232 of the side walls 228 in passageway 216. Each is positioned to engage the upper part of a corresponding one of the drainage openings 140 in the walls of base oval structure 108 when properly assembled. Ramps 236 have a rectangularly-shaped horizontal flat, upper surface 238 and a major flat side surface 240 that begins at a line slightly below upper surface 238 and continuously declines inwardly to eventually merge with the surface 232 of side wall 228. Ramps 236 are arranged and dimensioned side-to-side to snugly fit in the drainage openings 140 with the upper surface 236 eventually engaging the top of the latter in a snap-on locking manner.

The extended oval-tube-shaped, snap-on arrangement of the body to the base replaces the usual tongue or tab arrangements of prior art devices. The elongated oval yields easily when desired, but stays solidly locked when it is not desired that it be taken apart. This reliable, yet easily removable, design is very resistant to breakage, especially when compared to the tongue and pin arrangements now employed in prior art devices.

Figure 5:
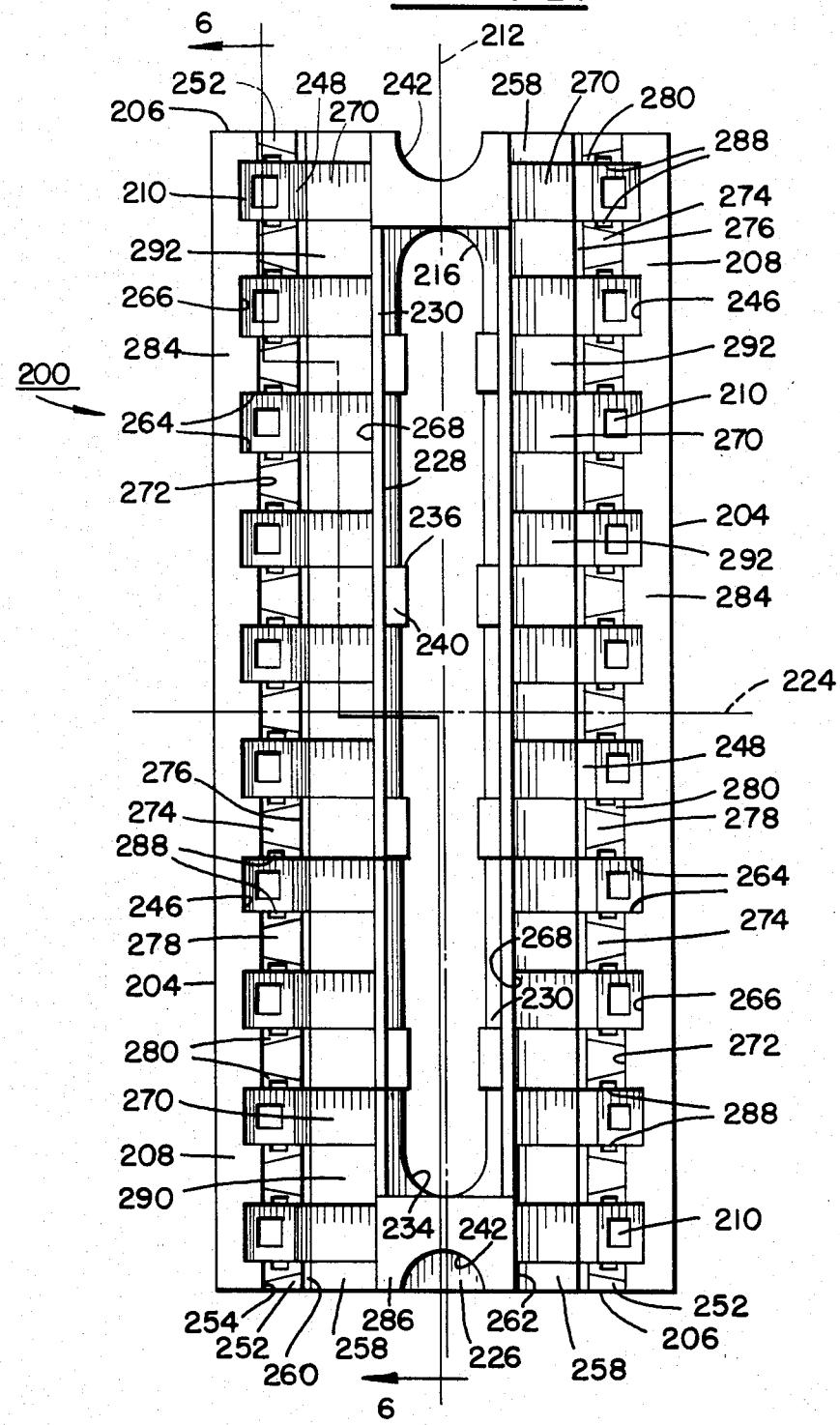

The end surfaces 206 of the body, as best seen in FIGS. 1 and 5, each have a centered vertically extending rounded groove or recess 242 running from the top surface 202. One of the recesses 242 houses a horizontally oriented tab or registration flag 226 which constitutes an effective means for determining or establishing connector assembly installation orientation. It will be apparent that the lack of such a tab or flag 226 at the opposite end may constitute an installation orientation identifier. It will be further appreciated that both ends of the connector assembly can be provided with tabs 226 in end recess 242, one of which can be removed such as by the user, as desired. It is noted that orientation tab or flag 226 is shown in FIG. 1 in dashed lines to indicate it has been removed.

The importance of the registration flag function is demonstrated, for example, by the consideration that the DIL connector has to show which is the first IC so that it can be placed adjacent the first chip. To do this correctly, the flag is utilized on the connector to show which end is a number one chip. Removing the proper end tab thus flags that as side number one.

The side surfaces 204 of the body 200 are defined by side walls 284 (FIGS. 1 and 7). The inner surface of each sidewall 284 is complex. It is comprised of squared-off recesses 266 vertically running from top to bottom which constitute the outermost part of the respective socket areas. Recesses 266 each have a major surface 246 extending parallel to the exterior side surface 204 from bottom surface 208 to terminate at the top surface 202 of the body at the outermost edge of the corresponding orifice 210 for receiving the IC lead. As may be gathered from FIG. 7 particularly, this outermost side surface 246 of the socket area, and indeed recess 266 itself, functions as a guide to the IC lead 502 for proper engagement of its free-end 504 with the free-end 304 of the contact 300.

Side surfaces 246, or side walls 284, may be provided with molded-in ramps 282 which, as schematically represented in FIG. 7, incline in a downwardly direction. The purpose of ramps 282 is to force the free end 304 of the contact 300 inwardly so that the contact lies substantially parallel to surface 246. The IC leads lie within a preferred range of about 0 degrees to 15 degrees outwardly from perpendicular to the IC body, as manufactured.

The entry hole 210, in the top surface 202 of the body for receiving the IC lead, is further defined by a downwardly directed lip or shoulder 248. Lip 248 angles downward from the ceiling 270 of the socket area to constitute the side of entry hole 210 opposite to the surface 246. Edge 244 of the shoulder or lip 248 (FIG. 7) in particular ensures that the contact 300 remains in place in the socket area when the IC lead is withdrawn, as is more particularly described hereinafter.

The remaining sides of holes 210 leading to the socket areas, and indeed the major portion of the socket areas themselves and particularly the outer portion, are defined by the side surfaces 264 of separations which extend inwardly from respective portions 272 (FIGS. 5B and 6) of the inner surface of side walls 284. They eventually join with the inner side surface 268 of the elongated side walls 228 defining the outer oval passageway 216. The separations are further defined hereinafter with particular regard to FIGS. 5B, 6 and 7.

Returning to FIG. 1 to complete the discussion of the end structure of the body 200, each end 206 is shown to have a complex major hollowed area symmetrically located about the perpendicular plane 220 that includes the longitudinal axis 212. This complex hollow begins at its outermost part with an initial indent area 250. Indent area 250 is defined by a substantially horizontal outwardly declining surface 252 which meets a substantially vertical outwardly declining surface 254 which, in turn, communicates with the bottom surface 208 of the body 200. Indent area 250 is shaped to accommodate the outermost part 146 of the bed 102 of the base 100. Specifically, surfaces 106 and 144 of the part 146 closely conform to surfaces 254 and 252, respectively, of the indent 250. As can be gathered from the Figures, in particular FIGS. 5B and 6, this indent area is repeated with regard to each of the aforementioned separators.

The complex hollow of body 200, best viewed in FIG. 1, is further defined by major recessed areas 256 located adjacent to and inwardly from indent portions 250. Major recesses 256 are defined by outer (260) and inner (262) vertical sides and an outwardly declining top side 258. The major recesses 256 are shaped to accommodate the elongate portions 104 of the base 100. Specifically, the vertical outer and inner side surfaces, excluding ribs 142, of elongate portions 104 closely conform to surfaces 260 and 262, respectively, of major recesses 256. Again, it can be gathered from the Figures that the general shape of major recesses 256, as defined by its sides 258, 260, 262, is repeated by each of the aforementioned separating structures between socket areas.

The complex hollow of the body 200, as seen in end view, is completed with a horizontal centered surface 286 running between the major recesses 256. It is flat and closely conforms to the top surface 110 of the base 100. Because of the oval structure defined by the walls 228 of the body and the conforming oval structure 108 of the base, surface 286 only extends inwardly from the end surface 206 of the body equivalent to surface 214 (FIGS. 5A and 5B).

The separators between adjacent socket areas have side surfaces 264 which correspond to the end sides of recesses 266. The separator side surfaces, thus, extend from the outermost part of the recesses 266; that is, from surfaces 246, of the side walls 284 across to join the inner surfaces 268 of center oval side walls 228. The vertical surfaces 268, in turn, define the innermost surface of the socket areas. This is so even as to the socket areas closest to the ends of the connector assembly since surface 268 effectively extends from one end 206 of the body to the other.

The ceiling 270 of each socket area begins with shoulder 248 of the opening 210 and extends inwardly to surface 268. The socket area defined by the ceiling surface 270, innermost side surface 268, side surfaces 264 and the major side surface 246 of recess 266, together with the conforming structure provided by the base 100, houses the upper portion of the contact beginning with the knee area 302 thereof (FIG. 7).

With more particular regard to configuration of the separators between adjacent socket areas, inner surfaces 272 of the body side walls 284 are provided with inwardly directed extensions 274, the sides of which comprise side surfaces 264. Extensions 274 vertically run from just above the bottom 208 of the body to the top thereof; that is, to the ceiling 270, to partly divide the extensive hollow of the body into individual socket areas. Extensions 274 are rectangular in cross-section, as taken in the plane of the body, with the long sides running parallel to the sides 204 of the body. They each have a substantially vertical surface 276 with an inwardly inclining slope and a substantially horizontal exposed bottom surface 278 also having an inwardly inclining slant. The side edges of the horizontal surface 278 have been removed or flattened, as like leveling, to form slanted surfaces 280. It will be appreciated that the shape of extensions 274, in particular the shape yielded by slanting surfaces 280, facilitates assembly of the body and base together.

In each of the portions of surfaces 264 that form the sides of extensions 274, or the outer side of the socket area in the case of those socket areas closest to the ends of the connector assembly, is a substantially squared-off (in cross-section) very shallow groove 288. Grooves 288 are intended to house the free end 304 of the contact. The portion of the extensions 274 lying between grooves 288 and the surface 246 of recesses 266, thus, effectively provides the molded-in ramp function discussed hereinbefore, and specifically with regard to the ramp 282 schematically represented in FIG. 7. Grooves 288 may be angled outwardly to a small degree toward the bottom of the body to accommodate the free end 304 of the contact 300 in the desired acute angle α (FIG. 1).

In connection with the outerside structure of the four socket areas closest to the ends 206 of the body, surfaces 252 correspond to surfaces 278 of the separator extensions 274 associated to the interior socket areas; surfaces 260 correspond to surfaces 276; and surfaces 254 correspond to surfaces 272.

The structure of the separators is completed with secondary extension portions 290 extending between primary extensions 274 and the inner side surface 268 of the oval side walls 228. Secondary extensions 290 extend downward from the ceiling 270 of the body to approximately ⅓ of the distance of the exposed bottom surface 278 of the primary extensions 274. Secondary extensions 290 also have an exposed bottom surface 292 which is substantially horizontal yet slightly inwardly inclined (FIG. 7). Again, in connection with the outer side structure of the four end socket areas, surfaces 258 correspond to surfaces 292 of the secondary extensions 290.

As can be gathered particularly from FIG. 7, the assembly of the body 200 and base 100 forms a longitudinally-extending space on either side of the connector which intercommunicates with each of the socket areas on the respective side. This space is bounded on its ends by end walls, 206. For the most part, the innermost side is comprised of surface 268 with help from the lowermost portions of side 130 of the base oval structure 108. The bottom is defined on the one hand by the floor of channels 114, which includes the surfaces 154 and 156 as well as the drainage chutes 152 (FIG. 4), and on the other hand by the elongate raised portions 104 of the base, in particular the inner side surfaces thereof together with the plateaus 134 and valleys 136. The outer side of the elongate intercommunicating space is provided by vertical surfaces 276 of extensions 274. Finally, the roof of the space is made up of the surfaces 292 of secondary extensions 290 alternating with portions of the ceiling 270. It will be appreciated that, notwithstanding the connector assembly according to the invention is of the closed-entry, closed-bottom type, the flux rinsing function is effectively provided via this interconnecting space which provides ample access to the drainage openings 140 and holes 148 from the socket areas.

With reference to FIG. 7, the connector assembly is illustrated in cross-sectional end view fully assembled and mounted onto a circuit board 400 with an IC 400 properly mounted to the connector. As shown, the IC 500 and circuit board 400, though in cross-section, are not illustrated by hatching for purposes of clarity.

The connector assembly rests on the top surface 408 of the circuit board by way of its pods 118. The pin portion 308 of the contact 300; that is, from point 310 downwards, is properly positioned in the circuit board hole 402 with its free-end 306 slightly protruding beyond the circuit board's bottom surface 410. The circuit board hole 402 has its sides 404 coated with a suitable metallic substance 406 which is electrically part of a circuit. Pin portion 308 is soldered into place as illustrated by the solder filling the hole 402. The pin portion 308 shown in the example embodiment of FIG. 7, as opposed to the straight pin of FIG. 1, includes an outwardly directed bump 312 oriented so as to provide an interference fit with the side edge of the hole 402 and in particular its metal coat 406. It will be appreciated that the pins of the opposite row of contacts are outwardly directed in the opposite direction with the bumps 312 of the two rows of pins thus cooperating to provide an effective interference fit; for example, for holding the connector in place, especially during soldering.

The contact 300 extends upward beyond point 310 into the interior of the connector assembly via the small opening provided by the mating of side walls 284 with its recesses 266 on the one hand and the outer portion 146 of the bed 102, and in particular its side edge 106, on the other hand. Shortly thereafter, the contact 300 has an inwardly directed elbow bend at 312 which enables the contact to closely follow the surfaces 106 and 144 of the base 100. The contact then rises vertically along the surface 150 of its corresponding rib 142 to a point where the top surface 148 of the rib is reached.

The contact then takes a major inwardly-directed knee bend at 302, extending almost horizontally toward the center of the connector assembly, but in a slight incline. This inclined portion of the contact passes through the socket area seat defined by the corresponding plateau 134 and valley 136 and on out into the elongate intercommunicating space of the connector. From there it begins the upward and then outward substantially circular bend like that of a question mark until it begins its descent in earnest at 318 located at the edge 244 of the shoulder 248 toward the outermost surface 246 of the socket area. The final portion of the contact from point 318 to its free end 304 is substantially straight and is poised for inward bending, which, by the placement of the knee bend 302, is shortly interrupted after only a moderate inward bending well within its elastic limit.

The IC lead 502 is shown fully inserted with its free-end 504 in proper engagement with the free end 304 of the contact 300. As such the appropriate angle α is formed therebetween. The edge of the contact free-end 304 is in such a case able to effectively achieve a gastight, high pressure contact with the IC lead and yet permit the withdrawal of the latter without undue force requirements or damage resulting. The shoulder 248 effectively prevents dislodgement of the contact during withdrawal of the IC lead by virtue of its position relative to the straight portion of the contact.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An improved dual-in-line connector assembly of the closed-entry, closed-bottom type having socket areas defined therein which are accessible from the assembly exterior and having contacts, each contact including an exposed pin portion extending through pin openings in the housing and a spring portion housed in a socket area of the housing, comprising:
   a drainage system including a plurality of drainage paths leading from the socket areas to orifices in the assembly exterior which are separated from the locations of pin openings in the housing,
   wherein a first configuration drainage path of the plurality is defined by a drainage chute associated with the floor of at least one socket area and a drainage opening abreast of the drainage chut which is in communication with the assembly exterior, each of the drainage openings communicating with a single elongated cavity which communicates with the assembly exterior, the drainage openings and the elongated cavity being formed by an extended oval-shaped projection of the base and wherein the body includes a centered portion defining an oval-shaped hollow which is configured to conform to the projection and to receive the latter when the base and body are assembled together.

2. The connector assembly of claim 1 wherein said drainage paths are non-metallic and include two different configurations.

3. The connector assembly of claim 2 wherein a second configuration drainage path of said plurality is defined by a drainage chute associated with the floor of at least one socket area and a drainage hole located in the bottom of the drainage chute which leads directly to the assembly exterior.

4. The connector assembly of claim 3 wherein all drainage paths associated to the socket areas on each side of the connector intercommunicate by way of an interconnecting space.

5. The connector assembly of claim 3 wherein a drainage path of said second configuration is provided for each pair of adjacent contacts.

6. The connector assembly of claim 5 wherein at least one of each type of configuration of drainage path is in operative communication with the socket area of each contact.

7. The connector assembly of claim 6 wherein said first and second drainage path configuration alternate in the longitudinal direction on each side of the connector.

8. The connector assembly of claim 1 wherein a drainage path from said drainage configuration is provided for each pair of adjacent contacts.

9. The connector assembly of claim 1 wherein said cavity is oval shaped and is centered to extend along the longitudinal axis in the underside surface of the assembly.

10. The connector assembly of claim 1 wherein all drainage paths associated to the socket areas on each side of the connector intercommunicate by way of an interconnecting space.

11. The connector assembly of claim 1 wherein said centered portion of said body has a plurality of inclined projections each arranged to engage a drainage opneing of said oval-shaped projection of the base in a snap-on locking assembly.

12. A dual-in-line connector assembly of the closed-entry, closed-bottom type for mounting electronic components such as integrated circuits to circuit boards and the like, said connector assembly having a base and a conforming body the integral structure of which defines a plurality of socket areas having floors and a pluraltiy of singular-element contacts each having an upper first portion housed in a socket area and a lower pin portion protruding from the assembly, wherein said contacts are comprised of flat strips of metallic material structured in question-mark-like configuration, with said first portion being substantially rounded and arranged in the associated socket area for engagement of the free-end thereof in a spring-loaded contact with a lead of the electronic component, and a drainage system for including a plurality of drainage ports leading from the socket areas to orifices in the assembly exterior which are separated from the places where the pin portions protrude from the assembly, said drainage paths being defined by drainage chutes associated with the floor of the socket areas and drainage holes located at the bottom of the drainage chutes which lead directly to the assembly exterior.

13. The connector assembly of claim 12 further including means associated with the exterior of the connector assembly for identifying the installation orientation thereof.

14. The connector assembly of claim 12 wherein said contacts are fabricated of beryllium copper.

15. The connector assembly of claim 14 wherein said pin portion of each contact includes an outwardly directed bump arranged to effect an interference fit in an associated hole in the circuit board.

16. The connector assembly of claim 12 wherein said contacts are fabricated of phosphor bronze.

17. The connector assembly of claim 12 wherein said contacts are fabricated of brass.

18. The connector assembly of claim 12 wherein the socket area is defined at least in part by a first surface for engaging the free-end of the first portion of the contact, said first surface and the part of the first portion of the contact leading to the free end thereof forming an acute angle.

19. The connector assembly of claim 18 wherein said first surface communicates with an opening to the socket area from the exterior of the connector and is positioned relative to said opening to guide the electronic component lead into engagement with the free-end of the connector first portion substantially at said angle.

20. The connector assembly of claim 19 wherein said contact first portion is arranged in the socket area relative to said first surface to effect a gas-tight high pressure electrical connection between the free end of said first portion and the electronic component lead.

21. The connector assembly of claim 19 wherein the socket area is further defined by a ceiling having a downwardly angled shoulder proximate to the opening to the socket area for preventing the contact from being dislodged when the lead of the electronic component is removed.

22. The connector assembly of claim 19 wherein said socket area is further defined by a contact seat for securing the lower part of the contact first portion.

23. The connector assembly of claim 22 wherein each contact has a knee bend separating the first portion from the pin portion located proximate said seat and wherein said knee bend is arranged relative to the free-end of said contact first portion to limit movement of the latter away from said first surface to within non-deforming displacements.

* * * * *